United States Patent
Yazawa et al.

(10) Patent No.: US 11,762,514 B2
(45) Date of Patent: Sep. 19, 2023

(54) CAPACITIVE SENSOR AND INPUT DEVICE

(71) Applicant: Alps Alpine Co., Ltd., Tokyo (JP)

(72) Inventors: Manabu Yazawa, Niigata-ken (JP); Ken Yamamura, Niigata-ken (JP); Sota Takahashi, Niigata-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 0 days.

(21) Appl. No.: 17/885,404

(22) Filed: Aug. 10, 2022

(65) Prior Publication Data
US 2022/0382413 A1 Dec. 1, 2022

Related U.S. Application Data

(63) Continuation of application No. PCT/JP2021/011469, filed on Mar. 19, 2021.

(30) Foreign Application Priority Data

Mar. 25, 2020 (JP) .................. 2020-054759

(51) Int. Cl.
*G06F 3/044* (2006.01)
*G01R 27/26* (2006.01)
*H01L 33/42* (2010.01)

(52) U.S. Cl.
CPC ....... *G06F 3/0443* (2019.05); *G01R 27/2605* (2013.01); *H01L 33/42* (2013.01); *G06F 2203/04111* (2013.01)

(58) Field of Classification Search
CPC ......... G06F 3/0443; G06F 2203/04111; G06F 3/0412; G06F 3/0446; G06F 3/044;
(Continued)

(56) References Cited

U.S. PATENT DOCUMENTS

2011/0227840 A1 9/2011 Sim et al.
2017/0235390 A1* 8/2017 Dong ............... G06F 3/0443
345/173
(Continued)

FOREIGN PATENT DOCUMENTS

JP  2011-192252  9/2011
JP  2015-118537  6/2015
(Continued)

OTHER PUBLICATIONS

International Search Report for International Application No. PCT/JP2021/011469 dated May 21, 2021.

*Primary Examiner* — Sahlu Okebato
(74) *Attorney, Agent, or Firm* — Beyer Law Group LLP

(57) ABSTRACT

A capacitive sensor has a structure in which first transparent electrode portions and second transparent electrode portions formed from crystalline indium tin oxide (ITO) are provided on a base material by patterning. A bridge wiring portion formed from amorphous indium zinc oxide (IZO) is provided on each two adjacent first transparent electrode portions and a link continuous to them, with an insulating layer intervening between the bridge wiring portion and the two first transparent electrode portions and link. These two adjacent second transparent electrode portions are electrically connected together by the bridge wiring portion. The thickness of the second transparent electrode portion TE and the thickness of the bridge wiring portion TB satisfy the following expressions: 0.28×TE+83 nm≤TB≤0.69×TE+105 nm; and 30 nm≤TE≤50 nm.

7 Claims, 13 Drawing Sheets

(58) Field of Classification Search
CPC ..... G06F 3/046; G01R 27/2605; H01L 33/42; H01L 25/167; H10K 59/40
See application file for complete search history.

(56) References Cited

U.S. PATENT DOCUMENTS

| | | |
|---|---|---|
| 2018/0253170 A1* | 9/2018 | Noh ..................... C23C 14/086 |
| 2019/0220117 A1 | 7/2019 | Yamai et al. |
| 2020/0371642 A1 | 8/2020 | Yamai et al. |

FOREIGN PATENT DOCUMENTS

| | | |
|---|---|---|
| JP | 2015-529899 | 10/2015 |
| WO | 2018-066214 | 4/2018 |
| WO | 2019-181396 | 9/2019 |

* cited by examiner

FIG. 5

| FILM THICKNESS | 100 nm | 140 nm | 160 nm |
|---|---|---|---|
| RESIDUAL | NO | NO | YES |
| IMAGE OF APPEARANCE TAKEN BY OPTICAL MICROSCOPE | NO RESIDUAL / GAP | NO RESIDUAL | THERE ARE RESIDUALS AS A WHOLE / PORTION FREE FROM RESIDUALS |
| IMAGE OF APPEARANCE TAKEN BY ELECTRON MICROSCOPE | | NO RESIDUAL | THERE ARE RESIDUALS. / RESIDUAL |

FIG. 13

| | COMPARATIVE EXAMPLE 1 | EMBODIMENT 1 | COMPARATIVE EXAMPLE 2 |
|---|---|---|---|
| TE | 50 nm | 50 nm | 50 nm |
| TB | 90 nm | 120 nm | 150 nm |
| WHITE | | | |
| GREEN (ELIGIBLE FOR EVALUATION) | | | |
| DECISION RESULT IN SENSORY TEST | B | A | B | ns
CAPACITIVE SENSOR AND INPUT DEVICE

CLAIM OF PRIORITY

This application is a Continuation of International Application No. PCT/JP2021/011469 filed on Mar. 19, 2021, which claims benefit of Japanese Patent Application No. 2020-054759 filed on Mar. 25, 2020. The entire contents of each application noted above are hereby incorporated by reference.

BACKGROUND OF THE INVENTION

1. Field of the Invention

The present invention relates to a capacitive sensor and an input device having the capacitive sensor.

2. Description of the Related Art

A capacitive sensor disclosed in International Publication No. WO 2018/066214 has: a base material having a translucent property; a plurality of first transparent electrodes having a translucent property, the first transparent electrodes being arranged along a first direction in a detection area on one main surface of the base material; a plurality of second transparent electrodes having a translucent property, the second transparent electrodes being arranged along a second direction crossing the first direction in the detection area, the second transparent electrodes including conductive nanowires; links provided integrally with the first transparent electrodes, each link electrically connecting two adjacent first transparent electrodes to each other; bridge wiring portions including an amorphous oxide material, the bridge wiring portions being provided separately from the second transparent electrodes, each bridge wiring portion electrically connecting two adjacent second transparent electrodes to each other; and a cover layer provided so as to cover the second transparent electrodes and the wiring portions. The refractive index of the cover layer is higher than the refractive index of the second transparent electrode and lower than the refractive index of the bridge wiring portion.

Japanese Unexamined Patent Application Publication No. 2015-118537 describes a case in which a transparent electrode is formed from indium tin oxide (ITO) and a bridge wiring portion has a laminated structure including indium zinc oxide (IZO) (particularly in paragraph 0042 and FIG. 4). Japanese Unexamined Patent Application Publication No. 2015-529899 describes that when a bridge wiring portion formed from a transparent conductive oxide (TCO) is provided, the bridge wiring portion can have a thickness of 5 nm or more and 70 nm or less (particularly in paragraph 0044).

SUMMARY OF THE INVENTION

With the capacitive sensor disclosed in International Publication No. WO 2018/066214, an insulating layer is placed between the bridge wiring portion and the first transparent electrode so that the bridge wiring portion can be kept insulated from the first transparent electrode. Therefore, even when amorphous IZO, which is superior in translucency, is used as the material of the bridge wiring portion, the vicinity of the bridge wiring portion has to have a complex structure when compared with other portions, making the vicinity likely to be visually recognized easily.

The present invention provides a capacitive sensor that can enhance the invisibility of an area including a bridge wiring portion with its machinability and environmental resistance taken into consideration when amorphous IZO is used as the material of the bridge wiring portion and crystalline ITO is used as the material of a transparent electrode electrically connected to the bridge wiring portion and of a transparent electrode laminated with an intervening between the transparent electrode and the bridge wiring portion, and also provides an input device having the capacitive sensor.

In one aspect, the present invention to solve the above problems is a capacitive sensor that has: a base material having a translucent property; a first transparent electrode that has a plurality of first transparent electrode portions having a translucent property, the first transparent electrode portions being arranged on the base material along a first direction, and also has links provided integrally with the first transparent electrode portions, each link electrically connecting two adjacent first transparent electrode portions to each other; a second transparent electrode that has a plurality of second transparent electrode portions having a translucent property, the second transparent electrode portions being arranged on the base material along a second direction crossing the first direction, and also has bridge wiring portions provided separately from the second transparent electrode portions, each bridge wiring portion electrically connecting two adjacent second transparent electrode portions to each other; and an insulating layer formed between the first transparent electrode and the bridge wiring portion. The second transparent electrode portion is formed from crystalline ITO, and the bridge wiring portion is formed from amorphous IZO. When the thickness of the second transparent electrode portion is denoted TE and the thickness of the bridge wiring portion is denoted TB, expressions (1) and (2) below hold.

$$0.28 \times TE + 83 \text{ nm} \leq TB \leq 0.69 \times TE + 105 \text{ nm} \quad (1)$$

$$30 \text{ nm} \leq TE \leq 50 \text{ nm} \quad (2)$$

Since the thickness TE of the second transparent electrode portion and the thickness TB of the bridge wiring portion are within the range represented by the two expressions above, the capacitive sensor is superior in environmental resistance, machinability (ease of selective etching), and invisibility. In particular, the closer TB is to $0.54 \times TE + 93$ nm, the more likely superior invisibility is to be obtained.

With the capacitive sensor described above, the base material may have a resin film, in which case the transparent electrode (second transparent electrode portion) intended to be formed from crystalline ITO and to be disposed on the base material is formed from amorphous ITO through heat treatment for crystallization. Even in this case, superior invisibility is achieved.

With the capacitive sensor described above, the first transparent electrode may be formed from crystalline ITO. In this case, the thickness of the first transparent electrode may be equal to the thickness of the second transparent electrode portion, and the first transparent electrode and the bridge wiring portion may cross each other with the insulating layer intervening between the first transparent electrode and the bridge wiring portion. Even in this case, superior invisibility is achieved.

With the capacitive sensor described above, the insulating layer may be formed from a resin material, and the refractive index of the insulating layer may be 1.5 or more and 2.0 or less. In this case, particularly superior invisibility is achieved.

In another aspect, the present invention provides an input device having the capacitive sensor described above and also has a light source disposed on the same side as the base material of the capacitive sensor. The light source may be an organic EL light-emitting element. Alternatively, the light source may be an integrated body of a plurality of light-emitting bodies, in which case the plurality of light-emitting bodies may be arranged at a pitch of 20 μm or less.

The present invention provides a capacitive sensor that is superior in environmental resistance, machinability (ease of selective etching) and invisibility, and also provides an input device having the capacitive sensor.

BRIEF DESCRIPTION OF THE DRAWINGS

FIG. 5 illustrates results of confirmation of the effect of an amorphous IZO etching liquid on a first transparent electrode portion and a second transparent electrode portion, which were formed from crystalline ITO, when part of the constituent material of a bridge wiring portion was left non-etched.

FIG. 13 illustrates observed images for three types of test structures when a white light source was used and when a green light source was used.

DETAILED DESCRIPTION OF EMBODIMENTS

Figure 1:
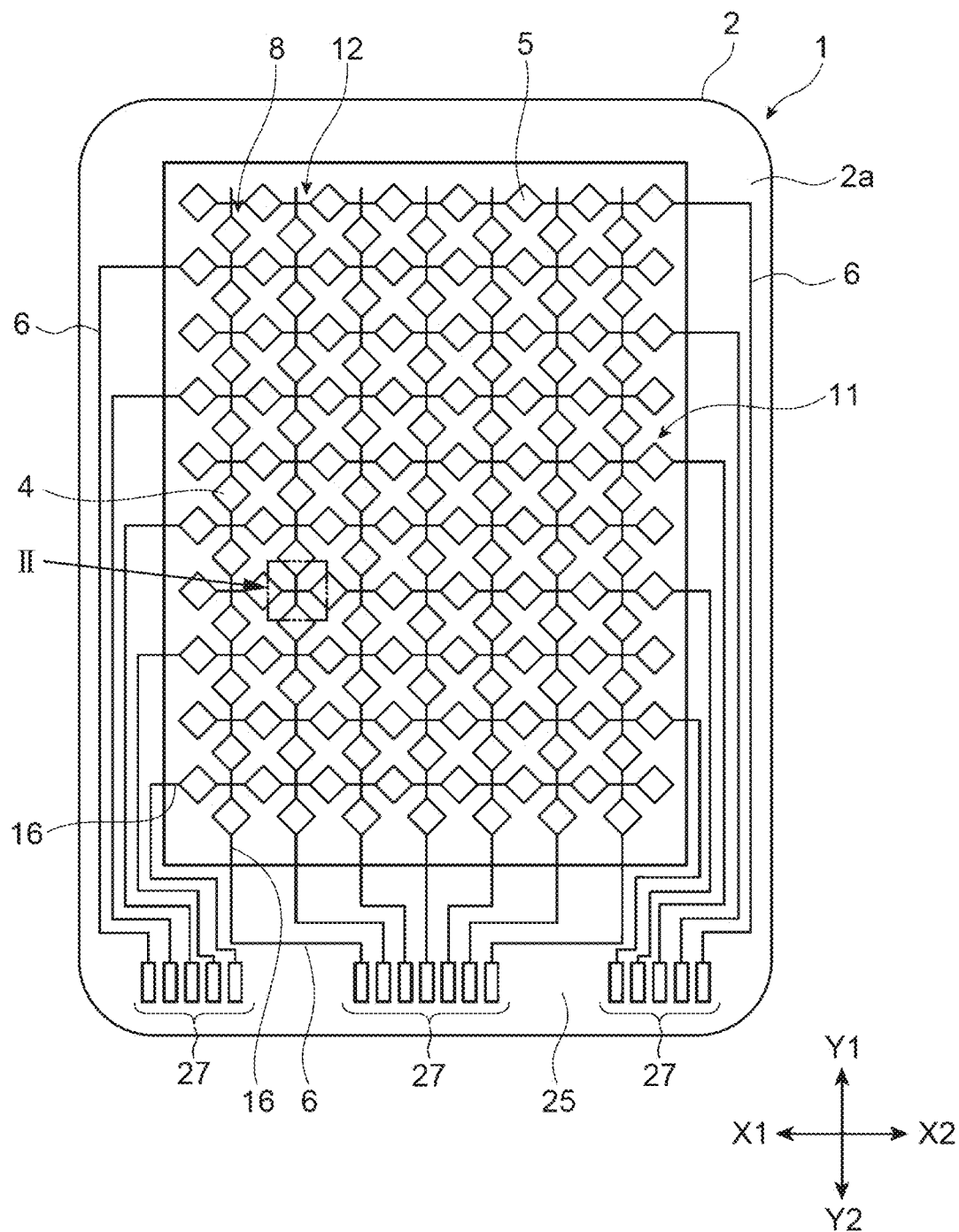
FIG. 1 is a plan view illustrating a capacitive sensor in an embodiment of the present invention.

Embodiments of the present invention will be described below with reference to the drawings. In the descriptions below, like members will be denoted by like reference characters and repeated descriptions will be appropriately omitted for members that have been described once.

Figure 2:
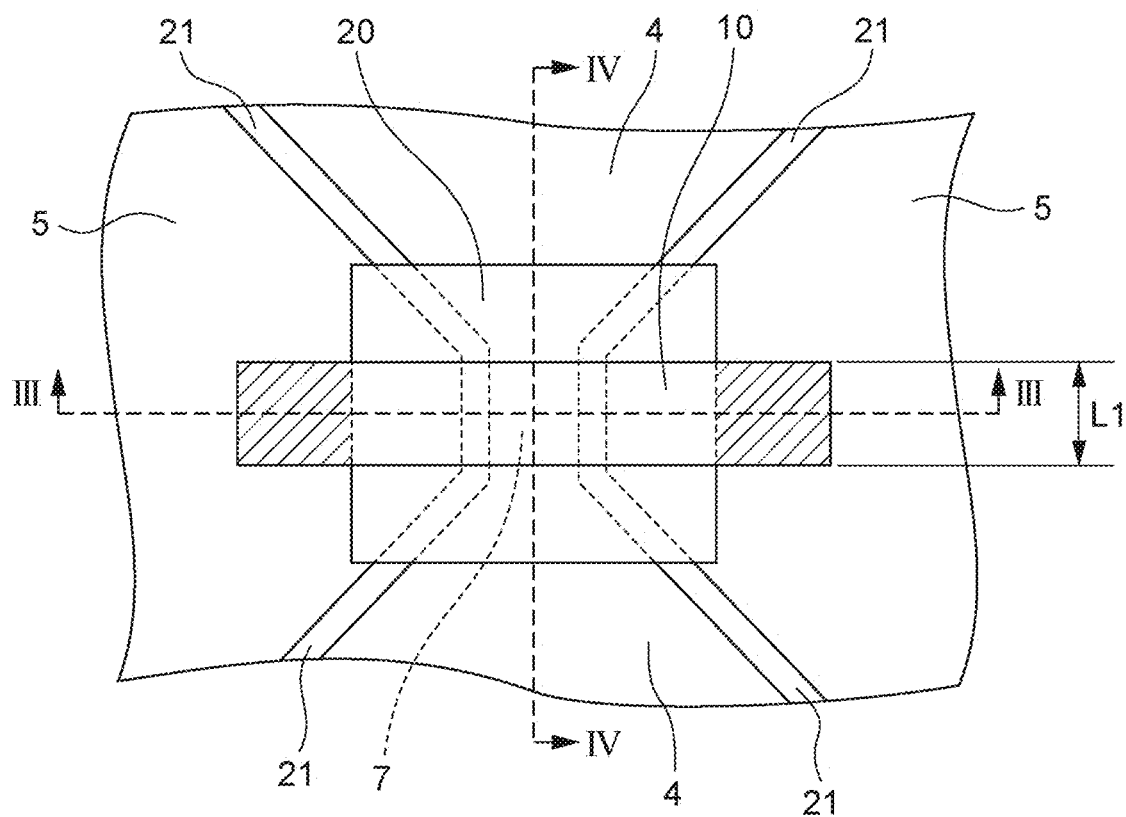
FIG. 2 is a plan view in which an area II in FIG. 1 is enlarged.
Figure 2:
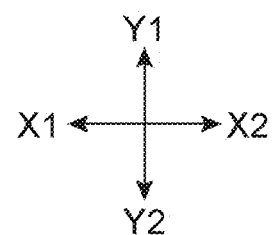
Figure 3:
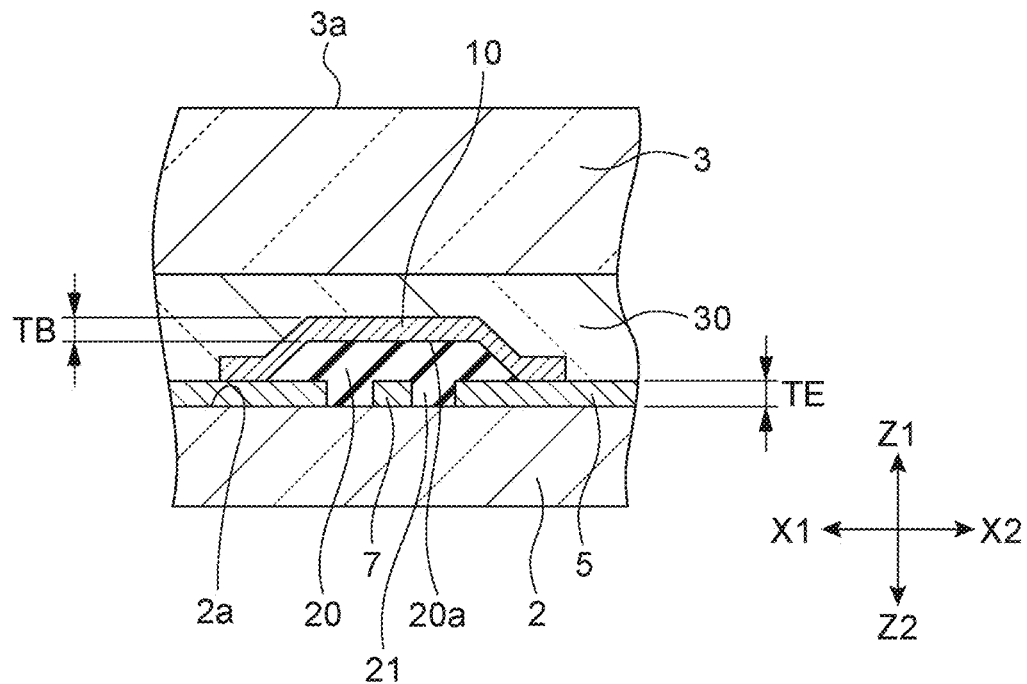
FIG. 3 is a sectional view taken along line in FIG. 2.
Figure 4:
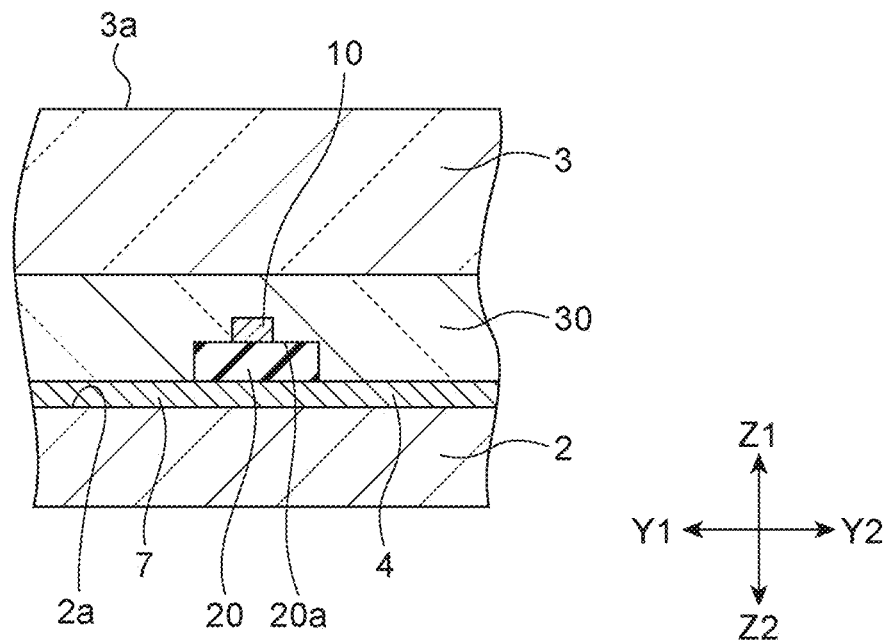
FIG. 4 is a sectional view taken along line Iv-Iv in FIG. 2.

FIG. 1 is a plan view illustrating a capacitive sensor 1 in an embodiment of the present invention. FIG. 2 is a plan view in which the area II in FIG. 1 is enlarged. FIG. 3 is a sectional view taken along line III-III in FIG. 2. FIG. 4 is a sectional view taken along line IV-IV in FIG. 2. Although transparent electrodes are invisible in reality because they are transparent, their outlines are illustrated in FIGS. 1 and 2 for easy understanding.

In the specification of this application, "transparent" and "translucent property" indicate a state in which visible light transmittance is 50% or higher (preferably, 80% or higher). Furthermore, it is preferable for the haze value to be 6% or lower. In the specification of this application, "light shielding" and "light shielding property" indicate a state in which visible light transmittance is lower than 50% (preferably, lower than 20%).

As illustrated in FIGS. 1 to 4, the capacitive sensor 1 in this embodiment has a base material 2, which is insulative, first transparent electrode portions 4, which are conductive, second transparent electrode portions 5, which are conductive, links 7, which are conductive, bridge wiring portions 10, which are conductive, and a cover layer 3, which is insulative. Insulating portions 21 are provided between the first transparent electrode portions 4 and the second transparent electrode portions 5, so the first transparent electrode portions 4 and second transparent electrode portions 5 are electrically insulated from each other. The cover layer 3 is disposed on the opposite side to the base material 2 when viewed from the bridge wiring portions 10. An optical clear adhesive (OCA) 30, which is insulative, is provided between the base material 2 and the cover layer 3. An insulating layer 20 is provided between the base material 2 and the bridge wiring portions 10 so as to fill the insulating portions 21 and cover each link 7 positioned between the bridge wiring portion 10 and the base material 2. At the portion where the bridge wiring portion 10 is disposed, the OCA 30 is disposed between the bridge wiring portion 10 and the cover layer 3 as illustrated in FIG. 3.

The base material 2 is formed from a resin-based material, a glass base material, or the like, having a translucent property, that may have a resin film made of polyethylene terephthalate (PET), cyclic olefin copolymer (COC), cyclic olefin polymer (COP), polycarbonate (PC), or the like. Heat resistance of a resin-based material is generally about 150° C. When a resin-based material is used as the base material 2, therefore, the upper limit of heat treatment temperature for a member stacked on the base material 2 is also about 150° C. There is no particular limit on the refractive index of the base material 2. When the base material 2 is formed from a resin-based material, however, the refractive index of the base material 2 may fall into the range of 1.4 to 1.6. The base material 2 may have a refractive index adjustment layer (index matching layer). The refractive index adjustment layer has a function for suppressing a drop in invisibility at a portion where transparent conductive materials (first transparent electrode portions 4 and second transparent electrode portions 5) are disposed due to interference between the base material 2 and a laminated structure composed of the base material 2 and the transparent conductive materials disposed on the base material 2. In the description below, results are indicated, which were obtained by studying invisibility between a laminated structure composed of the base material 2 and the transparent conductive materials (first transparent electrode portions 4 and second transparent electrode portions 5) disposed on the base material 2 and a structure in which the insulating layer 20 and bridge wiring portions 10 are further laminated on the laminated structure. This invisibility is not affected by whether the base material 2 has the refractive index adjustment layer.

The first transparent electrode portions 4 and second transparent electrode portions 5 are disposed on one of the main surfaces, of the base material 2, the normal of which is along the Z1-Z2 direction. The one main surface of the base material 2 is positioned on the Z1 side. The main surface will be referred to below as the front surface 2a. This will be described later in detail. As illustrated in FIG. 3, the cover layer 3, which has a translucent property, is disposed on the opposite side to the base material 2 when viewed from the bridge wiring portion 10. Materials of the cover layer 3 include glass base materials and resin-based materials such as polyethylene terephthalate (PET), polyolefin polymers (COC and COP), polycarbonate (PC), and polymethylmethacrylate (PMMA). A hard coat layer formed by dispersing translucent inorganic fine particles (exemplified by zirconia and titania) in a resin matrix may be provided on a resin-based material.

As illustrated in FIG. 1, the capacitive sensor 1 is composed of a detection area 11 and a non-detection area 25 when viewed from a direction (specifically, Z1-Z2 direction) along the normal of a surface on the same side as the cover layer 3. The detection area 11 is a region on which a manipulation can be performed with a manipulation body such as a finger. The non-detection area 25 is a region, shaped like a picture frame, that is positioned outside the outer circumference of the detection area 11. The non-detection area 25 is light-shielded by a decorative layer (not illustrated). In the capacitive sensor 1, light (exemplified by external light) from a surface on the same side as the cover layer 3 toward a surface on the same side as the base material 2 and light (exemplified by light from the backlight of a display device used in combination with the capacitive sensor 1) from the surface on the same side as the base material 2 toward the surface on the same side as the cover layer 3 are less likely to pass through the non-detection area 25.

As illustrated in FIG. 1, first transparent electrodes 8 and second transparent electrodes 12 are provided on the front surface 2a of the base material 2. The first transparent electrodes 8 are placed in the detection area 11. Each first transparent electrode 8 has a plurality of first transparent electrode portions 4. As illustrated in FIGS. 3 and 4, the plurality of first transparent electrode portions 4 are disposed on the front surface 2a. Each first transparent electrode portion 4 is linked through the link 7, which is elongated, in the Y1-Y2 direction (first direction). Then, the first electrodes 8, each of which has the plurality of first transparent electrode portions 4 linked in the Y1-Y2 direction, are arranged in the X1-X2 direction at intervals. The link 7, which is formed from the same material as the first transparent electrode portion 4, is integrated with first transparent electrode portions 4 to be linked to the link 7. The link 7 electrically connects two adjacent first transparent electrode portions 4 to each other.

The first transparent electrode portion 4 and link 7, which have a translucent property, may be formed from crystalline ITO. A film of crystalline ITO may be formed directly on the base material 2. Alternatively, a film of amorphous ITO may be firmed on the base material 2 and may then be crystallized through heat treatment. When crystallization is performed, the resistance is lowered, making it possible to increase conductivity. In an input device, which is one of applications to which the capacitive sensor 1 is applied, the size of a light-emitting body in a display element has been reduced, as will be described later. For example, the arrangement pitch has been reduced to about 20 µm or less. To assure the design freedom of the transparent electrode, therefore, there is a demand to lower the resistance value of a transparent electrode placed so as to be overlaid on the display element. Specifically, there is an increasing demand to narrow the width of the link 7. To respond to this demand, it is necessary to reduce the resistance value of the transparent conductive material from which the link 7 is formed. Therefore, crystalline ITO, instead of amorphous ITO, is desirable as ITO from which the link 7 is formed. The thickness of the first transparent electrode portion 4 and link 7, which are formed in the form of a film on the base material 2, is, for example, in the range from 20 nm to 150 nm. The range may be preferably from 20 nm to 60 nm, and may be more preferably from 30 nm to 50 nm.

The second transparent electrodes 12 are placed in the detection area 11. Each second transparent electrode 12 has the plurality of second transparent electrode portions 5. As illustrated in FIGS. 3 and 4, the plurality of second transparent electrode portions 5 are provided on the front surface 2a of the base material 2. Thus, the second transparent electrode portions 5 are disposed on the same surface (front surface 2a of the base material 2) as the first transparent electrode portions 4. The second transparent electrode portions 5 are linked through bridge wiring portions 10, which are elongated, in the X1-X2 direction (second direction). The second transparent electrodes 12, each of which has the plurality of second transparent electrode portions 5 linked in the X1-X2 direction, are arranged in the Y1-Y2 direction at intervals. The bridge wiring portion 10 is formed separately from the second transparent electrode portions 5. The X1-X2 direction crosses the Y1-Y2 direction. For example, the X1-X2 direction perpendicularly crosses the Y1-Y2 direction.

The second transparent electrode portion 5 is formed from a conductive material having a translucent property. The second transparent electrode portion 5 is preferably formed from crystalline ITO as with the material of the first transparent electrode portion 4. In the capacitive sensor 1, the thickness of the second transparent electrode portion 5 is 30 nm or more and 50 nm or less, as will be described later. The thickness of the second transparent electrode portion 5 may be equal to the thickness of the first transparent electrode portion 4 and link 7.

The bridge wiring portion 10 is formed from a material having a translucent property and including an amorphous oxide material. As an amorphous oxide material, at least one selected from the group consisting of amorphous indium tin oxide (ITO), amorphous indium zinc oxide (ILO), amorphous gallium-doped zinc oxide (GZO), amorphous aluminum-doped zinc oxide (AZO), and amorphous fluorine-doped zinc oxide (FTO) is used. The bridge portion 10 is preferably formed from amorphous IZO because it has a low resistance value and is superior in machinability (ease of selective etching when compared with crystalline ITO) and invisibility.

As illustrated in FIGS. 2 to 4, the insulating layer 20 is disposed on the front surface of the link 7, which links first transparent electrode portions 4. As illustrated in FIG. 3, the insulating layer 20 fills space between the link 7 and the second transparent electrode portion 5 and also rides on the front surfaces of the second transparent electrode portion 5. As the insulating layer 20, a cured material of a resin material such as, for example, a photosensitive transparent resin (exemplified by materials including novolak materials and acrylic materials) is used. The refractive index of the insulating layer 20 may be preferably in the range from 1.5 to 2.0. The refractive index of crystalline ITO from which the first transparent electrode portion 4 and second transparent electrode portion 5 are formed is in the range from 1.8 to 2.3, and the refractive index of amorphous IZO, which is a specific example of amorphous oxide material from which the bridge wiring portion 10 is formed, is in the range from 1.9 to 2.3. The refractive index of the insulating layer 20 is in the range from 1.5 to 2.0. Therefore, the difference in refractive index between the bridge wiring portion 10 and members positioned in the vicinity of the bridge wiring portion 10 is reduced, making the invisibility of the bridge wiring portion 10 likely to be improved. To stably improve the invisibility of the bridge wiring portion 10, the refractive index of the insulating layer 20 may be preferably in the range from 1.8 to 2.0.

As illustrated in FIGS. 3 and 4, the bridge wiring portion 10 is disposed so as to extend from the front surface 20a of the insulating layer 20 to the front surfaces of the second transparent electrode portions 5 positioned on both sides of the insulating layer 20 in the X1-X2 direction. The bridge wiring portion 10 electrically connects two adjacent second transparent electrode portions 5 to each other. The width L1 of the bridge wiring portion 10 is determined in consideration of electric properties (particularly resistance value) demanded for the bridge wiring portion 10, the thickness of the bridge wiring portion 10 (bridge thickness TB), which will be described later, the invisibility of the bridge wiring portion 10, and the like. Recently, it is required to enhance the invisibility of the bridge wiring portion 10. In view of this, the width L1 of the bridge wiring portion 10 tends to become thinner. Specifically, the width L1 of the bridge wiring portion 10 is preferably 100 μm or less, is more preferably 80 μm or less, and is further more preferably 50 μm or less. Since light-emitting bodies is becoming finer, when the capacitive sensor 1 is placed on a light source, the width L1 of the bridge wiring portion 10 may be preferably 40 μm or less and may be more preferably 20 μm or less.

As illustrated in FIGS. 3 and 4, the insulating layer 20 is disposed on the front surface of the link 7, which links first transparent electrode portions 4 together, and the bridge wiring portion 10, which connects second transparent electrode portions 5 together, is disposed on the front surface of the insulating layer 20. Thus, the insulating layer 20 is present between the link 7 and the bridge wiring portion 10, so the first transparent electrode portion 4 and second transparent electrode portion 5 are electrically insulated from each other. Since, in this embodiment, the first transparent electrode portion 4 and second transparent electrode portion 5 are disposed on the same surface (specifically, on the front surface 2a of the base material 2), the capacitive sensor 1 can be thinned.

The link 7 illustrated in FIGS. 2 to 4 is formed integrally with the first transparent electrode portion 4, and extends in the Y1-Y2 direction. The bridge wiring portion 10 illustrated in FIGS. 2 to 4 is formed on the front surface 20a of the insulating layer 20, which covers the link 7, separately from the second transparent electrode portion 5, and extends in the X1-X2 direction. However, the form in which the link 7 and bridge wiring portion 10 are placed is not limited to this. For example, the link 7 may be formed integrally with the first transparent electrode portion 4, and extends in the X1-X2 direction. In this case, the link 7 electrically connects two adjacent second transparent electrode portions 5 to each other. The bridge wiring portion 10 may be formed on the front surface 20a of the insulating layer 20, which covers the link 7, separately from the first transparent electrode portion 4, and extends in the Y1-Y2 direction. In this case, the bridge wiring portion 10 electrically connects two adjacent first transparent electrode portions 4 to each other. In the description of the capacitive sensor 1 in this embodiment, an example is used in which the bridge wiring portion 10 is formed on the front surface 20a of the insulating layer 20, which covers the link 7, separately from the second transparent electrode portion 5, and extends in the X1-X2 direction.

As illustrated in FIG. 1, a plurality of wiring portions 6 led out from the first transparent electrodes 8 and second transparent electrodes 12 are formed in the non-detection area 25. Each of the first transparent electrodes 8 and second transparent electrodes 12 is electrically connected to the wiring portion 6 through a connection wire 16. Each wiring portion 6 is connected to an external connection portion 27 that is electrically connected to a flexible printed circuit board (not illustrated). That is, the wiring portions 6 electrically connect the first transparent electrodes 8 and second transparent electrodes 12 to the external connection portion 27. The external connection portion 27 is electrically connected to the flexible printed circuit board (not illustrated) through, for example, a material that includes a conductive paste or a metal such as copper (Cu), a Cu alloy, a copper-nickel (CuNi) alloy, nickel (Ni), silver (Ag), gold (Au), or the like.

Each wiring portion 6 is formed from a material that includes a metal such as Cu, a Cu alloy, a CuNi alloy, Ni, Ag, Au, or the like. The connection wire 16, which is formed from a transparent conductive material such as an ITO material or metal nanowires, extends from the detection area 11 to the non-detection area 25. The wiring portion 6 is laminated on the connection wire 16 in the non-detection area 25 and is electrically connected to the connection wire 16.

The wiring portion 6 is disposed at a portion, on the front surface 2a of the base material 2, where the non-detection area 25 is positioned. The external connection portion 27 is also disposed at a portion, on the front surface 2a of the base material 2, where the non-detection area 25 is positioned, as is the wiring portion 6.

In FIG. 1, the wiring portion 6 and external connection portion 27 are illustrated so as to be viewed for easy understanding. In practice, however, a decorative layer (not illustrated) having a shielding property is provided at a portion where in the non-detection area 25 is positioned. Therefore, the wiring portion 6 and external connection portion 27 are hidden by the decorative layer and is not visible when the capacitive sensor 1 is viewed from a surface on the same side as the cover layer 3. Any material can be used to form the decorative layer if the material has a light shielding property. The decorative layer may have an insulating property.

In the capacitive sensor 1 in this embodiment, when a finger used as an example of a manipulation body is caused to come into contact with, for example, a surface 3a of the cover layer 3 as illustrated in FIG. 3, a capacitance is generated between the finger and the first transparent electrode portion 4 close to the finger and between the finger and the second transparent electrode portion 5 close to the finger. The capacitive sensor 1 can calculate the contact position of the finger according to a change in capacitance at this time. Specifically, the capacitive sensor 1 detects the X coordinate of the position of the finger according to a change in capacitance between the finger and the first transparent electrode 8 and detects the Y coordinate of the position of the finger according to a change in capacitance between the finger and the second transparent electrode 12 (the capacitive sensor 1 is of self-capacitance detection type).

Alternatively, the capacitive sensor 1 may be of mutual capacitance detection type. Specifically, the capacitive sensor 1 may apply a driving voltage to any one of a column of electrode portions of the first transparent electrode 8 and a row of electrode portions of the second transparent electrode 12, and may detect a change in capacitance between the finger and the other of the first transparent electrode 8 and the second transparent electrode 12. Thus, the capacitive sensor 1 detects the X coordinate of the position of the finger from one electrode and also detects the Y coordinate of the position of the finger from the other electrode.

With the capacitive sensor 1 in this embodiment, when the thickness of the second transparent electrode portion 5 is denoted TE and the thickness of the bridge wiring portion 10 is denoted TB, expressions (1) and (2) below hold.

$$0.28 \times TX + 83 \text{ nm} \leq TB \leq 0.69 \times TE + 105 \text{ nm} \quad (1)$$

$$30 \text{ nm} \leq TE \leq 50 \text{ nm} \quad (2)$$

These ranges will be described below.

A plurality of structural bodies (referred to below as test structural bodies) in which the thickness of the bridge wiring portion 10 differed were prepared. As illustrated in FIGS. 1 to 4, in each test structural body, first transparent electrode portions 4 and second transparent electrode portions 5 formed from crystalline ITO were provided by patterning on the base material 2 formed from a COP film; one bridge wiring portion 10 formed from amorphous IZO was provided on each two adjacent first transparent electrode portions 4 and the link 7, which electrically connected them together, with the insulating layer 20 intervening between the bridge wiring portion 10 and the first transparent electrode portions 4 and link 7, the insulating layer 20 being formed from a cured material of a photosensitive resist resin; and two adjacent second transparent electrode portions 5 were electrically connected by the bridge wiring portion 10. Environmental test was performed in which this structural body was left in an environment at a temperature of 85° C. and a relative humidity of 85% for 240 hours. The resistance value of the second transparent electrode 12 including the bridge wiring portion 10 was measured before and after the environmental test, and change ratios per hour in percent (%) ([resistance value after test−resistance value before test]/resistance value before test×100/test hours) were obtained. Table 1 indicates results.

TABLE 1

| Thickness of bridge wiring portion | 60 nm | 80 nm | 100 nm | 120 nm |
|---|---|---|---|---|
| Change ratio per hour [%/h] | 0.1 | 0.05 | 0.03 | 0.02 |
| Decision | Failure | Fair | Good | Good |

A tendency was confirmed in which the greater the thickness of the bridge wiring portion 10 was, the lower the resistance change ratio per hour was. It is assumed that if the thickness of the bridge wiring portion 10 is 80 nm or more, the resistance change ratio per hour is sufficiently low even in a normal environment (at a temperature of 25° C. and a relative humidity of 50%) even after the elapse of 1000 hours. From viewpoint of superior environmental resistance, the thickness of the bridge wiring portion 10 is more preferably 90 nm or more and is particularly preferably 100 nm or more.

For test structural bodies in which the thickness of the bridge wiring portion 10 differed, the effect of a lightly acidic etching solution on the first transparent electrode portion 4 and second transparent electrode portion 5 formed from crystalline ITO was confirmed, the lightly acidic etching solution being used to dissolve and remove amorphous IZO used in the patterning and machining of the bridge wiring portion 10. Specifically, the degree of residuals of the constituent material of the bridge wiring portion 10 after etching was confirmed. FIG. 5 indicates results.

As indicated in FIG. 5, when the thickness of the bridge wiring portion 10 was up to 140 nm, the surfaces of the first transparent electrode portion 4 and second transparent electrode portion 5 formed from crystalline ITO were not affected after the bridge wiring portion 10 was subjected to shape machining. The problem of residuals was not recognized. By contrast, when the thickness of the bridge wiring portion 10 was 160 nm, residuals were recognized on the entire surfaces of the first transparent electrode portion 4 and second transparent electrode portion 5. These residuals cause the first transparent electrode portion 4 and second transparent electrode portion 5 to be colored or lower the transmittance. Therefore, when the first transparent electrode portion 4 and second transparent electrode portion 5 are formed from crystalline ITO or when the bridge wiring portion 10 is formed from amorphous IZO, it is preferable to set the thickness of the bridge wiring portion 10 to 160 nm or less.

Test structural bodies in which the thickness of the base material 2 was 40 μm and the thickness of the insulating layer 20 was 1.5 μm were prepared. In these structural bodies, the thickness (referred to below as the electrode thickness TE) of the first transparent electrode portion 4 and second transparent electrode portion 5 and the thickness (referred to below as the bridge thickness TB) of the bridge wiring portion 10 were varied. The spectrophotometer CM-3700A from Konica Minolta was used to measure transmission spectroscopic data $tE(\lambda)$ at a portion (base portion) composed of a stack of the base material 2 and first transparent electrode portion 4 and to measure transmission spectroscopic data $tB(\lambda)$ at a portion (bridge portion) composed of a stack of the base material 2, first transparent electrode portion 4, insulating layer 20, and bridge wiring portion 10.

Figure 6A:
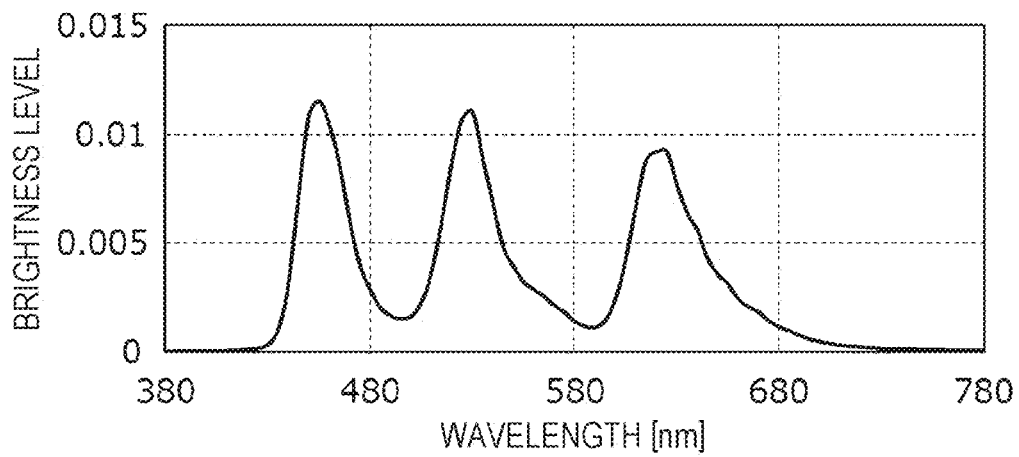
FIG. 6A illustrates spectrum data of spectrophotometric data of white light from an organic electroluminescent (EL) light-emitting element.
Figure 6B:
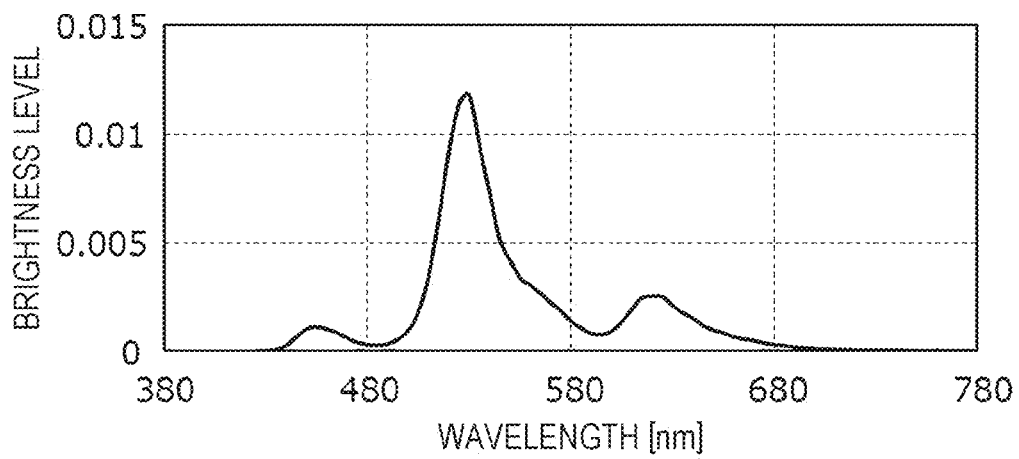
FIG. 6B illustrates spectrum data of spectrophotometric of green light from an organic EL light-emitting element.

Spectrophotometric data $Sw(\lambda)$ about white light from an organic EL light-emitting element and spectrophotometric data $Sg(\lambda)$ about green light from another organic EL light-emitting element were measured as light source information. FIG. 6A illustrates spectrum data of spectrophotometric data about white light, and FIG. 6B illustrates spectrum data of spectrophotometric data about green light.

Figure 6C:
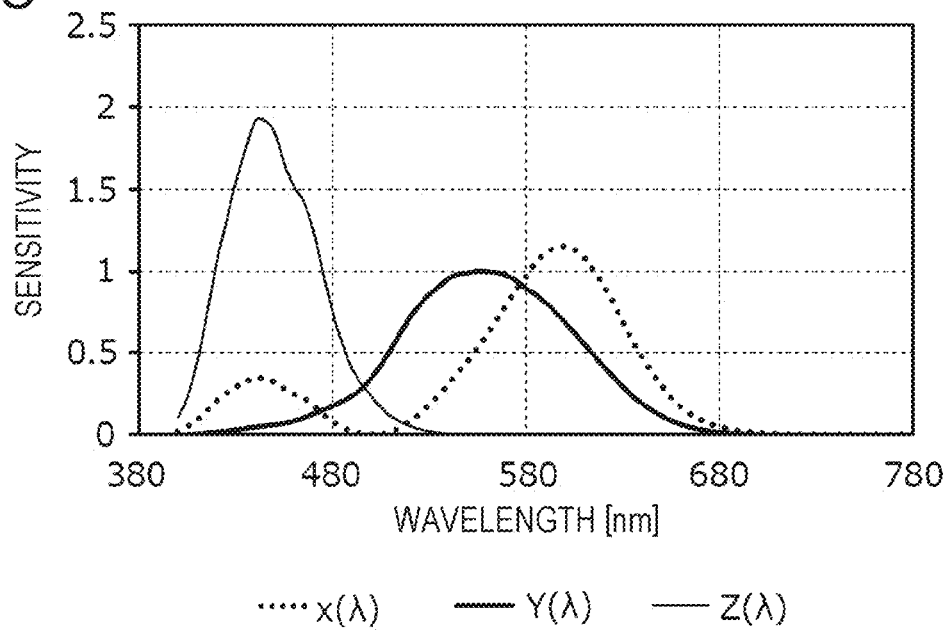
FIG. 6C illustrates tristimulus values of color matching functions in an XYZ display color system.

The amounts of color mixing X0, Y0, and Z0 in an XYZ display color system at the base portion were obtained by using the measured transmission spectroscopic data $tE(\lambda)$ at the base portion, spectrophotometric data $Sw(\lambda)$ about white light, and tristimulus values $x(\lambda)$, $y(\lambda)$, and $z(\lambda)$ of color matching functions in the XYZ display color system. FIG. 6C illustrates the tristimulus values $x(\lambda)$, $y(\lambda)$, and $z(\lambda)$ of the color matching functions in the XYZ display color system.

Similarly, the amounts of color mixing X, Y, and Z in the XYZ display color system at the bridge portion were obtained by using the measured transmission spectroscopic data $tB(\lambda)$ at the bridge portion, spectrophotometric data $Sw(\lambda)$ about white light, and tristimulus values $x(\lambda)$, $y(\lambda)$, and $z(\lambda)$ of the color matching functions in the XYZ display color system.

A color difference ΔE for white light was obtained from these values, according to expression (3) below.

$$\Delta E = \{(X-X0)^2 + (Y-Y0)^2 + (Z-Z0)^2\}^{1/2} \quad (3)$$

When the electrode thickness TE was 50 nm, the color difference ΔE for green light was also obtained similarly. Table 2 lists the obtained values of the color difference ΔE.

increase nor a monotone decrease, but a tendency was confirmed in which the color difference ΔE was peculiarly lowered at a certain value of the bridge thickness TB.

Figure 8:
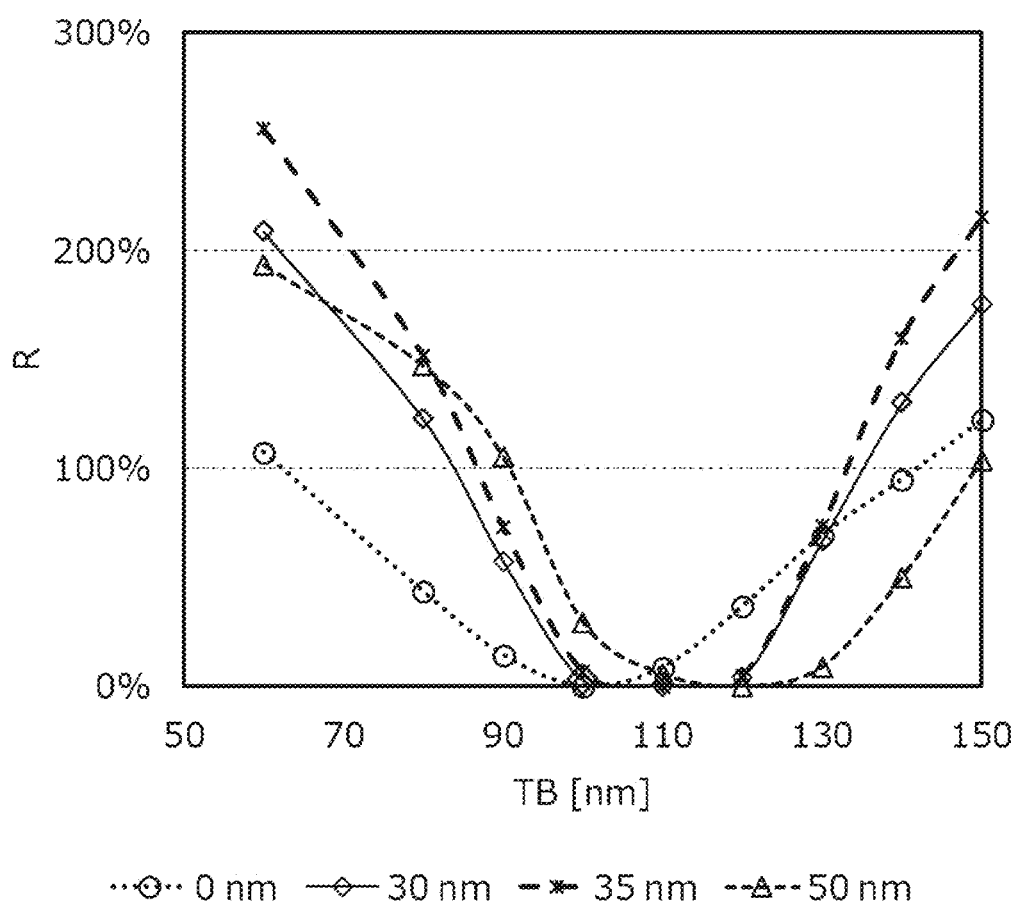
FIG. 8 is a graph illustrating a relationship among the electrode thickness, the bridge thickness, and a change ratio about the color difference when white light was used as the light source.

This tendency is more clearly confirmed from Table 3 and FIG. 8. Specifically, when the white light source was used, the bridge thickness TB at which the minimum color difference ΔE0 was obtained was 100 nm when the electrode

TABLE 2

| Light source | TE | Color difference ΔE TB | | | | | | | | |
|---|---|---|---|---|---|---|---|---|---|---|
| | | 60 nm | 80 nm | 90 nm | 100 nm | 110 nm | 120 nm | 130 nm | 140 nm | 150 nm |
| White | 0 nm | 16.7 | 11.5 | 9.2 | 8.0 | 8.7 | 11.0 | 13.6 | 15.7 | 17.9 |
| | 30 nm | 13.2 | 9.5 | 6.7 | 4.4 | 4.3 | 4.5 | 7.1 | 9.8 | 11.8 |
| | 35 nm | 12.4 | 8.7 | 6.0 | 3.7 | 3.5 | 3.6 | 6.0 | 9.0 | 11.0 |
| | 50 nm | 14.3 | 12.1 | 10.0 | 6.3 | 5.2 | 4.9 | 5.3 | 7.3 | 9.9 |
| Green | 50 nm | 8.6 | 7.9 | 6.4 | 4.7 | 2.6 | 1.9 | 2.0 | 3.9 | 5.8 |

A change ratio R in percent (%) was obtained for the minimum color difference ΔE0, which is the color difference for the bridge thickness TB at which the color difference ΔE is minimized under different values of the electrode thickness TE. The change ratio R is represented by [color difference ΔE−minimum color difference ΔE0]/minimum color difference ΔE0×100. Table 3 indicates results. In Table 3, the bridge thickness TB at which the R is 0% is the bridge thickness TB that gives the minimum color difference ΔE0 at the corresponding electrode thickness TE.

thickness TE was 0 nm, 110 nm when the electrode thickness TE was 30 nm or 35 nm, and 120 nm when the electrode thickness TE was 50 nm. Thus, a tendency was found in which the greater the electrode thickness TE was, the greater the bridge thickness TB at which the minimum color difference ΔE0 was obtained was. A possible cause of this tendency is interference between light passing through the base portion and light passing through the bridge portion.

It was also confirmed that changes between the minimum color difference ΔE0 and the color difference ΔE at other

TABLE 3

| Light source | TE | R TB | | | | | | | | |
|---|---|---|---|---|---|---|---|---|---|---|
| | | 60 nm | 80 nm | 90 nm | 100 nm | 110 nm | 120 nm | 130 nm | 140 nm | 150 nm |
| White | 0 nm | 107% | 44% | 14% | 0% | 9% | 37% | 69% | 95% | 122% |
| | 30 nm | 209% | 123% | 58% | 3% | 0% | 4% | 67% | 130% | 175% |
| | 35 nm | 256% | 152% | 73% | 7% | 0% | 5% | 74% | 160% | 215% |
| | 50 nm | 194% | 147% | 105% | 29% | 6% | 0% | 9% | 50% | 104% |
| Green | 50 nm | 360% | 322% | 246% | 152% | 38% | 0% | 6% | 111% | 210% |

Figure 7:
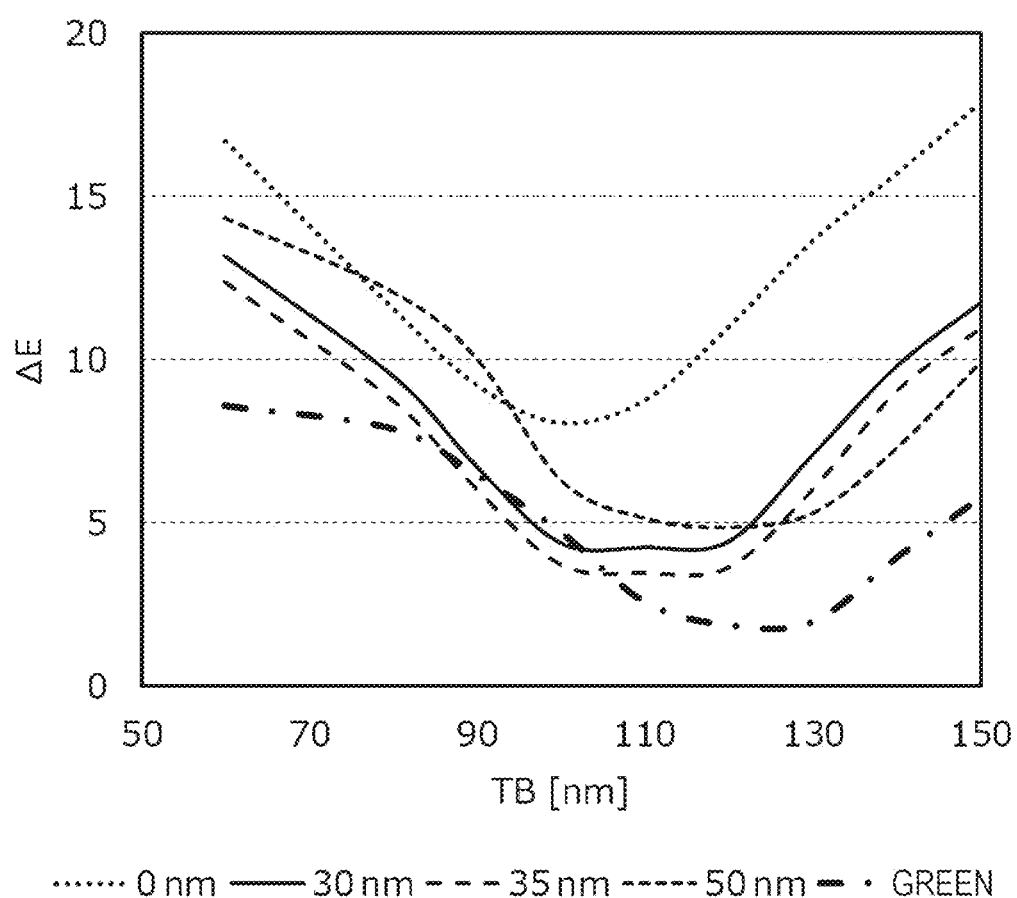
FIG. 7 is a graph illustrating the effect of electrode thickness and bridge thickness on color difference when white light was used as a light source.
Figure 9:
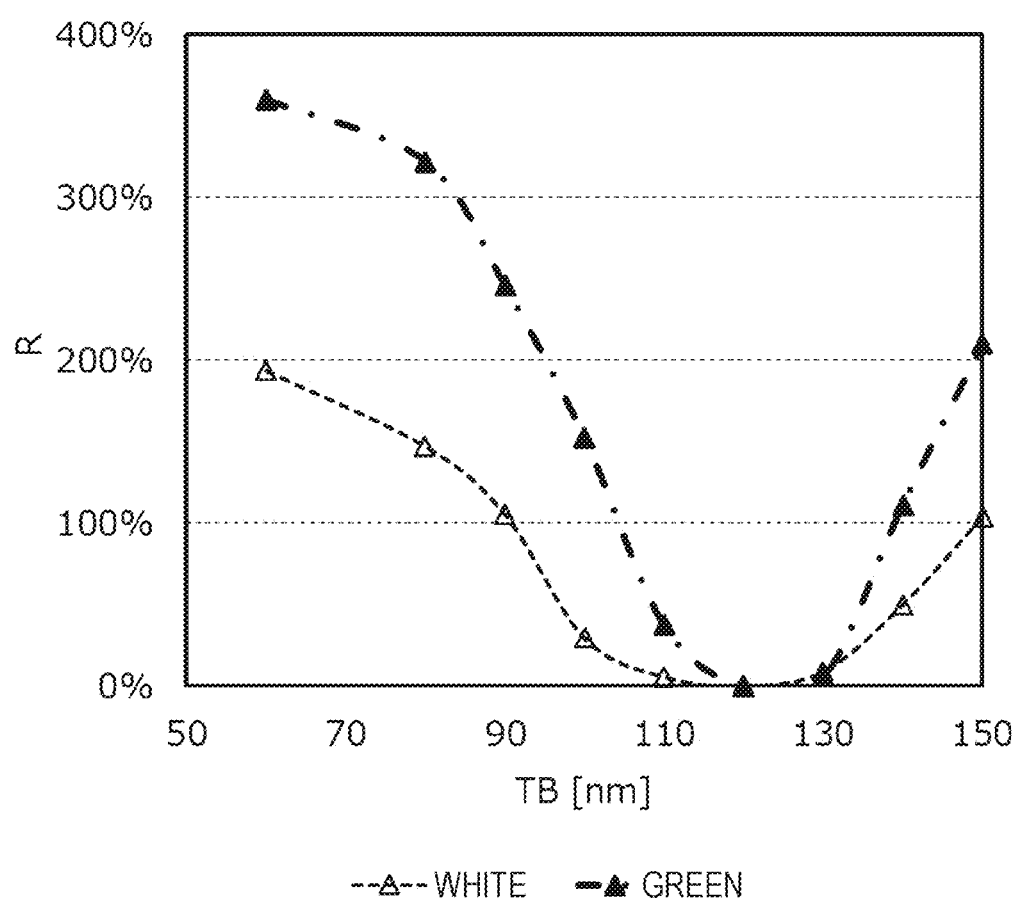
FIG. 9 is a graph illustrating the effect of light sources on the relationship among the electrode thickness, the bridge thickness, and the change ratio about the color difference.

FIG. 7 illustrates the results in Table 2. FIG. 8 illustrates the results, in Table 3, for the white light source. FIG. 9 illustrates the effect of the light sources according to results in Table 3 when the electrode thickness TE was 50 nm.

As seen from Table 2 and FIG. 7, when the second transparent electrode portion 5 was provided at the base portion, a basic tendency was found in which the color difference ΔE was lower than when the second transparent electrode portion 5 was not provided at the base portion (the electrode thickness TE was 0 nm), regardless of the value of the bridge thickness TB. At all values of the electrode thickness TE, the relationship between the bridge thickness TB and the color difference ΔE was neither a monotone values of the bridge thickness TB was more outstanding when the green light source was used than when the white light source was used, as illustrated in FIG. 9.

According to Table 3, the bridge thickness TB at which the change ratio R becomes 100% and 50% when the white light source is used was obtained by interpolation for different values of the electrode thickness TE. Table 4 indicates results, together with the data in Table 3. In Table 4, results when the change ratio R is 0% are underlined, results when the change ratio R is 50% are boldfaced, and results when the change ratio R is 100% are italicized.

TABLE 4

| White light source | | | | | | | |
|---|---|---|---|---|---|---|---|
| TE = 0 nm | | TE = 30 nm | | TE = 35 nm | | TE = 50 nm | |
| TB [nm] | R | TB [nm] | R | TB [nm] | R | TB [nm] | R |
| 60 | 107% | 60 | 209% | 60 | 256% | 60 | 194% |
| 62 | *100%* | 80 | 123% | 80 | 152% | 80 | 147% |
| 78 | 50% | *83* | *100%* | *87* | *100%* | 90 | 105% |
| 80 | 44% | 90 | 58% | 90 | 73% | *91* | *100%* |

TABLE 4-continued

| White light source | | | | | | | |
|---|---|---|---|---|---|---|---|
| TE = 0 nm | | TE = 30 nm | | TE = 35 nm | | TE = 50 nm | |
| TB [nm] | R | TB [nm] | R | TB [nm] | R | TB [nm] | R |
| 90 | 14% | 91 | 50% | 94 | 50% | 97 | 50% |
| 100 | 0% | 100 | 3% | 100 | 7% | 100 | 29% |
| 110 | 9% | 110 | 0% | 110 | 0% | 110 | 6% |
| 120 | 37% | 120 | 4% | 120 | 5% | 120 | 0% |
| 124 | 50% | 127 | 50% | 127 | 50% | 130 | 9% |
| 130 | 69% | 130 | 67% | 130 | 74% | 140 | 50% |
| 140 | 95% | *135* | *100%* | *133* | *100%* | *149* | *100%* |
| *142* | *100%* | 140 | 130% | 140 | 160% | 150 | 104% |
| 150 | 122% | 150 | 175% | 150 | 215% | | |

Figure 10:
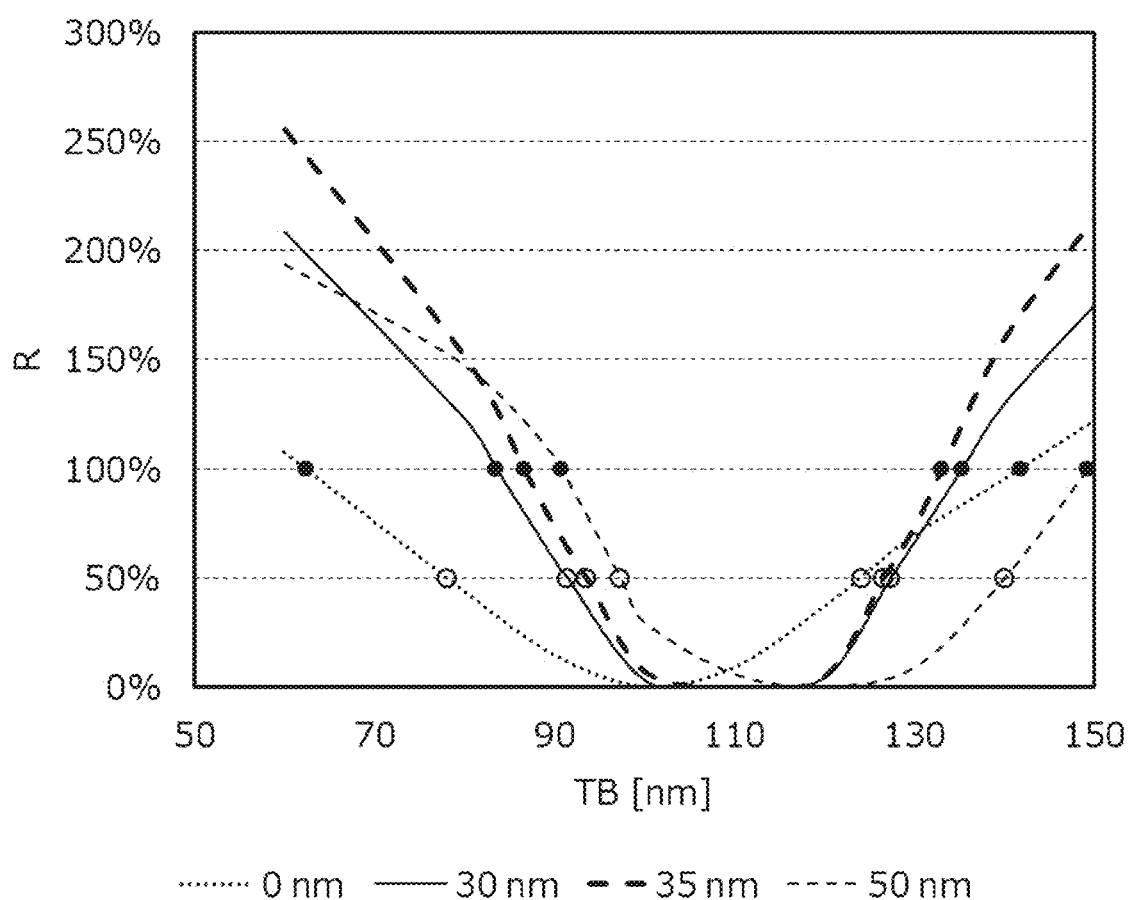
FIG. 10 is a graph illustrating a relationship between the bridge thickness and the change ratio for different values of the electrode thickness when white light was used as the light source.

FIG. 10 is a graph in which the data in Table 4 is plotted. In FIG. 10, data when the change ratio R was 50% is plotted as white circles (○) and data when the change ratio R was 100% is plotted as black circles (●). From these results, a tendency was confirmed in which the greater the electrode thickness TE was, the greater the bridge thickness TB at which the change ratio R became 0% was. Similarly, a tendency was confirmed in which the greater the electrode thickness TE was, the more the entire range of the bridge thickness TB in which the change ratio R fell to or below 50% shifted to the right side in FIG. 10 (to larger values of the bridge thickness TB).

Figure 11:
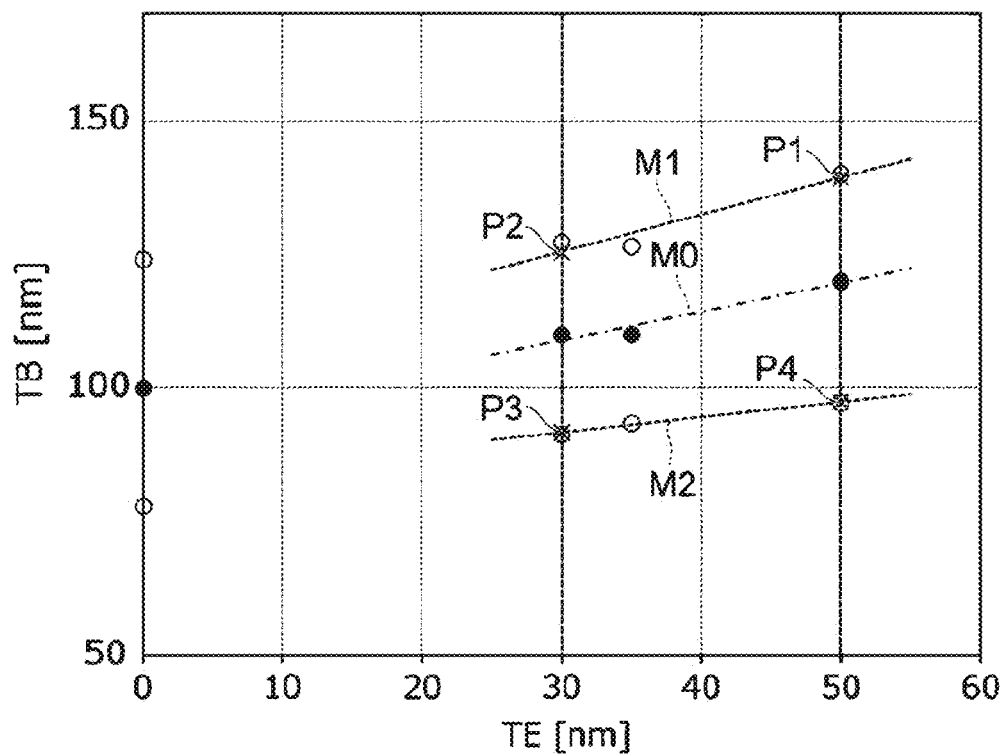
FIG. 11 is a graph illustrating a relationship between the electrode thickness and the bridge thickness when the change ratio was 0% or 50%.

FIG. 11 is a graph in which results in Table 4 at which the change ratio R was 0% and results in Table 4 at which the change ratio R was 50% are plotted in a coordinate system with the electrode thickness TE on the horizontal axis and the bridge thickness TB on the vertical axis. The coordinate system will be referred to below as the TE-TB coordinate system. In FIG. 11, results at which the change ratio R was 0% are plotted as black circles (●) and results at which the change ratio R was 50% are plotted as white circles (○). Since the situation when the electrode thickness TE was 0 nm differed from situations in other cases, an approximate expression was obtained according to the results when the electrode thickness TE was 30 nm, 35 nm, and 50 nm. FIG. 11 illustrates results.

An approximate expression was obtained by using results in Table 4 at which the change ratio R was 0%: specifically, these results are points at which TE [nm] and TB [nm] are (30, 110), (35, 110), and (50, 120) in the TE-TB coordinate system. The obtained approximate expression can be represented by expression (4) below. In FIG. 11, expression (4) is indicated by a dash-dot line M0.

$$TB=0.54\times TE+93 \text{ nm} \quad (4)$$

An expression representing the upper limit of a range in which the change ratio R falls to or below 100% in Table 4 was obtained from results each of which represents the upper limit of a range in which the change ratio R falls to or below 50%: specifically, these results are points at which TE [nm] and TB [nm] are (30, 127), (35, 127), and (50, 140) in the TE-TB coordinate system. As a result, expression (5) below was obtained. In FIG. 11, expression (5) is indicated by a dashed line M1.

$$TB=0.69\times TE+105 \text{ nm} \quad (5)$$

Similarly, an expression representing the lower limit of a range in which the change ratio R falls to or below 50% was obtained from results each of which represents the lower limit of a range in which the change ratio R falls to or below 100%: specifically, these results are points at which TE [nm] and TB [nm] are (30, 91), (35, 94), and (50, 97) in the TE-TB coordinate system. As a result, expression (6) below was obtained. In FIG. 11, expression (6) is indicated by a dashes line M2.

$$TB=0.28\times TE+83 \text{ nm} \quad (6)$$

The electrode thickness TE is set within the range indicated expression (2) below in consideration of the electric properties of the first transparent electrode portion 4 and second transparent electrode portion 5, invisibility (lightness of colors), and machinability (ease of crystallization through heat treatment).

$$30 \text{ nm} \leq TE \leq 50 \text{ nm} \quad (2)$$

If the electrode thickness TE is too small, the resistance value is likely to become high. When the base material 2 is formed from a resin-based material, an ITO material provided on the base material 2 is sometimes formed by a method in which a film of amorphous ITO is first formed, after which the film is crystallized through heat treatment to reduce the resistance value. If the electrode thickness TE is too small, this crystallization through heat treatment may be less likely to progress. By contrast, if the electrode thickness TE is too large, coloring occurs. The insulating portion 21 between the first transparent electrode portion 4 and second transparent electrode portion 5 is sometimes formed by removing IT(I) having conductivity, which case the smaller the electrode thickness TE is, the lower machinability (ease of pattern etching) is, making precision after machining likely to drop.

In view of this, when the electrode thickness TE and bridge thickness TB are set so as to satisfy expressions (1) and (2) above, the capacitive sensor 1 superior in environmental resistance, machinability, and invisibility can be obtained. To satisfy expressions (1) and (2) above means to set the electrode thickness TE and bridge thickness TB so as to fall into the range of a quadrangle P1P2P3P4 formed by four points P1 to P4 below in the TE-TB coordinate system.

P1(TE [nm], TB [nm])=(50, 140)
P2(TE [nm], TB [nm])=(30, 126)
P3(TE [nm], TB [nm])=(30, 91)
P4(TE [nm], TB [nm])=(50, 97)

Results obtained by specifically observing the test structural bodies will be given below for a case in which both expressions (1) and (2) above were satisfied, a case in which the bridge thickness TB was too small, and a case in which the bridge thickness TB was too large.

Figure 12:
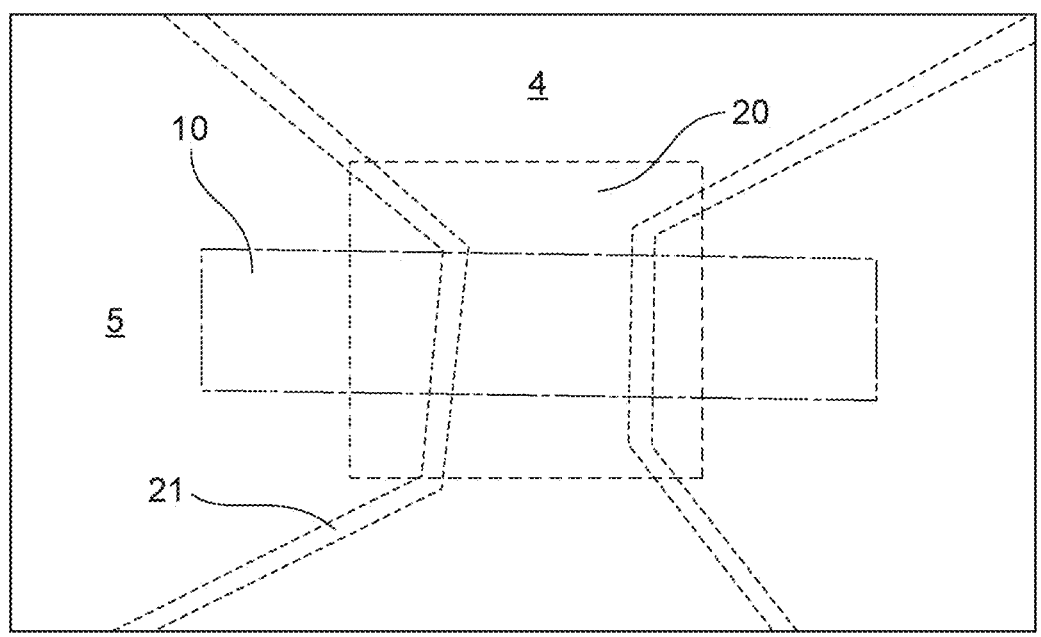
FIG. 12 conceptually illustrates the structure of an observed test structure.

FIG. 12 conceptually illustrates a test structural body in an observation field of view. As illustrated in FIG. 12, the first transparent electrode portion 4, second transparent electrode portion 5, insulating portion 21, insulating layer 20, and bridge wiring portion 10 were placed in the observation field of view. The insulating layer 20 represented substantially as a rectangle in FIG. 12 was 300 μm by 340 μm in size.

FIG. 13 illustrates images obtained by observing three types of wiring structural bodies when the white light source was used and when the green light source was used. With a wiring structural body in comparative example 1, the electrode thickness TE was 50 nm and the bridge thickness TB was 90 nm. With a wiring structural body in embodiment 1, the electrode thickness TE was 50 nm and the bridge thickness TB was 120 nm. With a wiring structural body in comparative example 2, the electrode thickness TE was 50 nm and the bridge thickness TB was 150 nm. Results at the bottom in FIG. 13 are sensory evaluation results of invisibility, which were obtained by observing the wiring structural bodies in embodiment 1 and comparative examples 1 and 2 under the green light source. Since green is the color to which the human eye is most sensitive in changes in brightness, the green light source was selected as the light source in sensory evaluation.

Specifically, sensory evaluation was performed by a method described below. To prepare objects eligible for observation, the wiring structural bodies were placed on the light illumination surface of the light source in which an organic EL light-emitting element was used as a light-emitting body, and a polarization plate, the transmission direction of which is along the bridging direction (X1-X2 direction) of the bridge wiring portion 10, was then placed on the wiring structural bodies. The objects eligible for observation were visually observed under sunlight and under fluorescent light from the same side as the polarization plate. During the observation of the objects eligible for observation, the line of vision was moved. For example, the objects eligible for observation were observed along the lamination direction (Z1-Z2 direction) of the objects eligible for observation and in a direction slightly inclined from the lamination direction. In visual observation, direct visual recognition of the shape of the bridge wiring portion 10 was not possible. However, in the observation of the objects eligible for observation in the region indicated in FIG. 12, when the bridge wiring portion 10 was not noticeable in contrast with the first transparent electrode portion 4 and second transparent electrode portion 5 placed around the bridge wiring portion 10 and flicker was less likely to be visually recognized when the line of vision was moved, invisibility was decided to be superior (indicated as A in FIG. 13). By contrast, when the bridge wiring portion 10 was noticeable in contrast with the first transparent electrode portion 4 and second transparent electrode portion 5 placed around the bridge wiring portion 10 and flicker was likely to be visually recognized when the line of vision was moved, invisibility was decided to be faulty (indicated as B in FIG. 13).

As a result, as illustrated in FIG. 13, the laminated structural body in embodiment 1, in which the electrode thickness TE and bridge thickness TB fall into the range of the bridge thickness TB in which the change ratio R is 50% or less in FIG. 11, yielded superior invisibility. By contrast, the laminated structural bodies in comparative examples 1 and 2, in which the electrode thickness TE and bridge thickness TB fall into the range of the bridge thickness TB in which the change ratio R exceeds 50% in FIG. 11, did not yield superior invisibility. Therefore, it was confirmed that the capacitive sensor 1 superior in invisibility is obtained by setting the electrode thickness TE and bridge thickness TB so that they fall into the range of the quadrangle P1P2P3P4 in FIG. 11.

Figure 14:
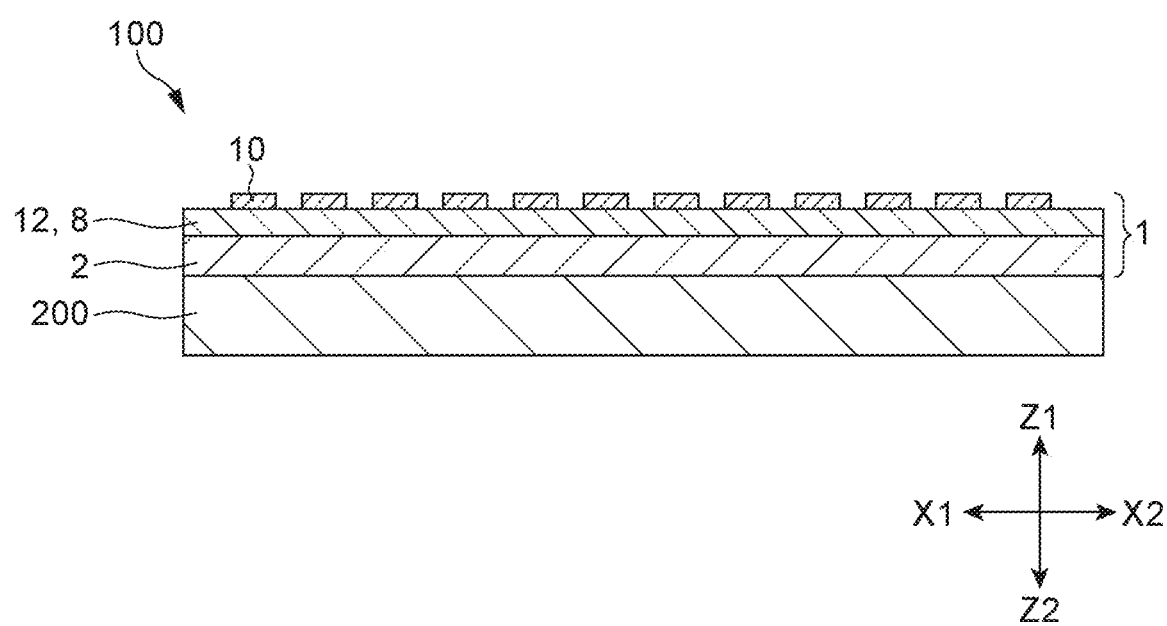
FIG. 14 illustrates an input device in an embodiment of the present invention.

FIG. 14 illustrates an input device in an embodiment of the present invention. As illustrated in FIG. 14, the input device 100 in this embodiment has a light source 200 and the capacitive sensor 1 in the embodiment described above. The capacitive sensor 1 is disposed so that its surface on the same side as the base material 2 (Z2 side in the Z1-Z2 direction) faces the light source 200. The light source 200 can emit light toward the Z1 side in the Z1-Z2 direction. Specific examples of the light source 200 include an organic EL light-emitting element (OLED), a laminated structural body including a liquid crystal optical element and a light source, and a micro light-emitting diode (LED) array, in which micro LEDs are arrayed on a substrate. When the light source 200 is an integrated body of a plurality of light-emitting bodies, even if the plurality of light-emitting bodies are arranged at a pitch of 20 μm or less, the capacitive sensor 1 in this embodiment can have invisibility without losing appropriate electric properties (particularly resistance value).

Embodiments have been described for easy understanding of the present invention and do not to limit the present invention. Therefore, each element disclosed in the above embodiments is intended to include all design changes and equivalents included in the technical range of the present invention.

What is claimed is:
1. A capacitive sensor comprising:
a base having a translucent property;
a first transparent electrode including:
  a plurality of first transparent electrode portions having a translucent property, the first transparent electrode portions being arranged on the base along a first direction; and
  a plurality of link portions provided integrally with the first transparent electrode portions to electrically connect two adjacent first transparent electrode portions to each other;
a second transparent electrode including:
  a plurality of second transparent electrode portions having a translucent property, the second transparent electrode portions being arranged on the base along a second direction crossing the first direction; and
  a plurality of bridge wiring portions provided separately from the second transparent electrode portions to electrically connect two adjacent second transparent electrode portions to each other; and
an insulating layer formed between the first transparent electrode and each of the plurality of bridge wiring portions,
wherein the plurality of second transparent electrode portions are formed of crystalline indium tin oxide (ITO), and the plurality of bridge wiring portions are formed of amorphous indium zinc oxide (IZO),
and wherein a thickness TE of each second transparent electrode portion and a thickness TB of each bridge wiring portion satisfy following expressions (1) and (2):

$$0.28 \times TE + 83 \text{ nm} \leq TB \leq 0.69 \times TE + 105 \text{ nm} \tag{1}$$

$$30 \text{ nm} \leq TE \leq 50 \text{ nm} \tag{2}.$$

2. The capacitive sensor according to claim 1, wherein the base includes a resin film.

3. The capacitive sensor according to claim 1, wherein:
the first transparent electrode is formed of crystalline ITO;

a thickness of the first transparent electrode is equal to the thickness TE of the second transparent electrode portion; and the first transparent electrode and each of the plurality of bridge wiring portions cross each other with the insulating layer interposed therebetween.

4. The capacitive sensor according to claim 1, wherein the insulating layer is formed of a resin material and has a refractive index equal to or greater than 1.5 and equal to or smaller than 2.0.

5. An input device comprising:
the capacitive sensor according to claim 1; and
a light source disposed on the base on a same side as that on which the capacitive sensor is disposed.

6. The input device according to claim 5, wherein the light source is an organic electroluminescent (EL) light-emitting element.

7. The input device according to claim 5, wherein the light source is an integrated body of a plurality of light-emitting bodies arranged at a pitch of 20 μm or less.

* * * * *